United States Patent
Shlesinger

(10) Patent No.: US 7,608,766 B2
(45) Date of Patent: Oct. 27, 2009

(54) POLYMER TREATED SURFACES AND METHODS FOR MAKING

(76) Inventor: Todd Evan Shlesinger, 4455 Cherry Tree La., Eldersburg, MD (US) 21784

( * ) Notice: Subject to any disclaimer, the term of this patent is extended or adjusted under 35 U.S.C. 154(b) by 937 days.

(21) Appl. No.: 10/740,001

(22) Filed: Dec. 18, 2003

(65) Prior Publication Data
US 2004/0255751 A1 Dec. 23, 2004

Related U.S. Application Data

(63) Continuation of application No. 10/002,789, filed on Nov. 26, 2001, now abandoned.

(60) Provisional application No. 60/253,211, filed on Nov. 27, 2000, provisional application No. 60/265,274, filed on Jan. 31, 2001, provisional application No. 60/326,418, filed on Oct. 2, 2001, provisional application No. 60/330,018, filed on Oct. 18, 2001.

(51) Int. Cl.
G10D 3/10 (2006.01)

(52) U.S. Cl. .................................. 84/297 R; 84/297 S
(58) Field of Classification Search .............. None
See application file for complete search history.

(56) References Cited

U.S. PATENT DOCUMENTS

| | | | |
|---|---|---|---|
| 2002/0136893 A1* | 9/2002 | Schlesinger | 428/375 |
| 2003/0121394 A1* | 7/2003 | Hebestreit et al. | 84/297 R |
| 2007/0017334 A1* | 1/2007 | Hebestreit et al. | 84/100 |
| 2007/0026515 A1* | 2/2007 | Newman et al. | 435/289.1 |

* cited by examiner

Primary Examiner—Marlon T Fletcher

(57) ABSTRACT

The performance of musical instrument strings is improved by treating the strings with a polymer vapor, avoiding problems common with spray type polymer coatings, extruded or laminate coatings or wipe-on liquid coatings, including heat damage, imprecise dimensional control, possible flaking, peeling or easy removal of the coating or adverse changes or damping of the musical qualities of the strings. The treatment may be applied either to the core of said strings, to strands wrapped around the core, or both. The treatment may be applied either before or after wrapping said strands around said core.

40 Claims, 9 Drawing Sheets

PLASMA SPUTTER DEPOSITION SYSTEM

FIG 1: PLASMA SPUTTER DEPOSITION SYSTEM

FIG 2: ION BEAM DEPOSITION SYSTEM

FIG 3: LASER DEPOSITION SYSTEM

FIG 4: PLASMA CHEMICAL VAPOR DEPOSITION SYSTEM

FIG 5: HOT FILAMENT CHEMICAL VAPOR DEPOSITION SYSTEM

FIGURE 6: MUSICAL STRING TREATED WITH VAPOR DEPOSITED POLYMER

POLYMER TREATED SURFACES AND METHODS FOR MAKING

CROSS-REFERENCE TO RELATED APPLICATIONS

This application is a continuation of U.S. application Ser. No. 10/002,789 filed Nov. 26, 2001 now abandoned which claims priority to U.S. provisional patent application Nos. 60/253,211 for "Improved Strings for Musical Instruments" filed Nov. 27, 2000, 60/265,274 for "Improved Strings for Musical Instruments" filed Jan. 31, 2001, 60/326,418 for "Musical Strings" filed Oct. 2, 2001 and 60/330,018 for "Vapor Deposited Polymer Coating" filed Oct. 18, 2001. The entire disclosures of all of these applications are incorporated herein by reference.

FIELD AND BACKGROUND OF THE INVENTION

1. Field of the Invention

The present invention relates in general to polymer vapor surface treatments and coatings, in particular to polymer vapor surface treatments and coatings as applied to musical instrument strings; even more specifically, it relates to polytetrafluoroethylene ("PTFE") polymer vapor surface treatments and coatings applied to musical instrument strings.

2. Background Information

The invention described and claimed herein comprises a vapor phase polymeric surface treatment. One specific application of such a surface treatment is applied to musical instrument strings. Examples of such strings are guitar, violin, cello, bass, piano and harp strings.

Surface coatings, and surface treatments, are well-known in the art. As used herein, surface coating means an attached laminate or jacket, positioned on the substrate, while surface treatment means a modified surface region of the substrate which is in fact part of the substrate.

A musical instrument string typically comprises a core of material and optionally additional strands of the same or other material wound around the core. The composition and dimensions of the core and the optional windings are chosen so as to produce the desired tones when the string is caused to vibrate.

U.S. Pat. No. 4,945,856 deals with the vapor deposition of parylene polymer in low vacuum. This material has been used in the electronics and medical area, but it has several times higher friction coefficient as does PTFE. The process is performed in a lesser degree of vacuum, which does not offer the same purity as high vacuum processes. The level of adhesion of this coating does not lend itself to applications where surface abrasion (strumming) is an issue as it can fray and delaminate fairly easily from the coated article. There exist stronger binding forces within the coating itself than between the coating and substrate. It is believed that this effect is responsible for the way in which a parylene coating can be peeled from the substrate, whereas the PTFE polymer vapor surface treatment can not.

U.S. Pat. No. 3,767,559 deals with RF sputter deposition of PTFE as an improvement over DC means, which are not applicable to insulators such as PTFE, but does not mention the use as a coating on musical strings.

U.S. Pat. No. 4,539,228 deals with extending the life of musical instrument strings through the application of PTFE in an oil lubricant. While some of the benefits of applying PTFE to a musical string are gained, the material is not adhered to the surface in the same way that a vapor deposited polymer is condensed and nucleated onto the surface.

U.S. Pat. No. 5,578,775 discloses a musical instrument string having an inner bundle embedded in a mantle of precious metal and an abrasive resistant treatment of short regions of the string (those which are either struck while playing or which contact the instrument) and discloses surface hardening using phosphate coating, vapor plating, flame coating or ion plating.

U.S. Pat. No. 5,883,319 deals with the bonding of a GORE-TEX(™) expanded PTFE ("e-PTFE") gauze to the surface of the wound type of musical instrument strings, using an adhesive. The gauze sheet is then covered with a heat shrink or polymer jacket.

U.S. Pat. No. 5,888,591 teaches deposition of PTFE using Chemical Vapor Deposition (CVD), with no specific mention of use for musical strings. The preferred method in the current invention uses Physical Vapor Deposition (PVD) which has been documented to result in a harder, more wear resistant polymeric-material, possibly attributed to the higher degree of cross linking of the polymeric material resulting from PVD processing.

A general reference describing deposition techniques and alternatives is "Plasma Deposition and Treatment of Polymers", ed. W. W. Lee, R. d'Agostino, and M. R. Wertheimer, ISBN 1-55899-450-5, published by Materials Research Society.

Spray type coatings have been applied to musical instrument strings, but can affect the musical quality as they change the mechanical properties of the string due to excessive coating thickness, and the attached laminate being distinct from the substrate, causing deadening of the musical sound. The "Black Maxima" TEFLON (™) spray coated string had been previously marketed by Maxima, approximately 10 years ago. Applicants believe that this product was discontinued as the coating would become unattached from the string, and degrade musical performance. Also, the high temperature oven baking processes used to cure spray type coatings onto the surface can harm the base metal. Oil based and other wipe-on type coatings are not well adhered to the substrate, and will offer only short term benefits. Still other types of extruded coatings or jacketed coatings can adversely affect sound quality, due to the damping of the sound vibrations and subsequent muffling of the sound.

SUMMARY OF THE INVENTION

The invention comprises polymer vapor treatment of musical instrument strings. The performance of musical instrument strings is improved by treating the strings with a polymer vapor, avoiding problems common with spray type polymer coatings, extruded or laminate coatings or wipe-on liquid coatings, including heat damage, imprecise dimensional control, possible flaking, peeling or easy removal of the coating or adverse changes or damping of the musical qualities of the strings.

The treatment may be applied either to the core of said strings, to strands wrapped around the core, or both. The treatment may be applied either before or after wrapping said strands around said core.

Among the advantages of the invention, polymer vapor treated strings offer better performance than untreated strings, having lower friction and a smoother sensation while playing. The polymeric treatment provides lessened tarnish and corrosion of the strings from finger perspiration and prevents contaminants from attaching to the surface, which can degrade sound quality.

Due to the manner in which the vapor condenses and nucleates onto the surface, and fills and attaches to micro-voids and surface porosity, there is the additional advantage of reduced break-in time needed to achieve the optimum musical properties of the string. This is attributed to the lubricating action of the surface treatment on the string vibrations as the mechanical waves cause a frictional drag within surface metallurgical cracks, which are in motion during the harmonic vibrations. In contrast, other processes rely on mechanical bonding or adhesives to attach the thicker polymer jackets or other macroscopic laminates, which can cause additional deadening of the sound. Therefore, using the disclosed invention, improved sound quality is realized as soon as the strings are installed on the instrument and the polymer-vapor surface treatment process will not adversely change the sound quality of the strings as do other coating processes.

Another advantage of polymer vapor treatment of musical strings is that both the wound strings and the single strand strings are treated, resulting in consistent performance and surface feel while playing the instrument. Coating of only wound strings can result in uneven feel and sound while playing from treated to untreated strings. Musicians comment that when playing coated strings which have 2 or 3 strings uncoated out of 6 (guitar), there is a distinct difference in feel when playing across from coated to uncoated, and vice versa. Several citations of musician's comments have stated that either a distinct "hitting the brakes" or, conversely, "Van Halen" effect (sliding) was experienced when using coated strings offering only a fraction of the total number of strings in the set with a coating applied, as is offered by competitive processes.

Competitive coating processes are not adapted well to coating the higher frequency (treble) strings. Both a difficulty in adhering the thicker coated layer to the treble strings, and also the undesirable effect of damping of the vibration (and deadening of the sound) is evident the most in the high frequency vibration of the treble strings. Therefore, only 3 or 4 out of 6 strings (guitar) are coated in the competitive processes. There also has been some issue with fraying of the adhered type of coatings after time.

Vapor deposit is preferable to other methods (such as spray coating) due to the low temperature process and better dimensional control available from vapor processes. The nature of the polymer vapor surface treatment, nucleated onto the surface, does not flake or peel from the substrate as do thicker coatings or laminates.

The precise dimensional control of vapor deposition also provides minimal deviation in the uniformity of the diameter of the treated wire; this is critical in the world of stringed musical instruments where even minute variations of string diameter along the length of the wire can result in out-of-tune harmonic vibrations of the string, causing diminished sound quality.

The use of PTFE polymer vapor surface treatment of musical instrument strings provides improved surface properties of the strings with no adverse effects to the musical properties.

Frequent comments from musicians using competitive "coated" strings is that while they enjoy the benefit of improved feel and longer lasting strings, there is a distinct deadening of the sound. The current invention provides the benefits of improved playability, extended life, reduced break-in period, with no deadening of the sound, or even improved sound timbre and tone detected by some musicians.

It is believed that the polymer vapor process provides a method for treatment of the microscopic surface features of the string with PTFE nucleates. This serves to provide a treated surface, rich in polymeric material, with no distinct junction between coating and substrate as exists in competitive products. The equations governing mechanical vibration of 2 separate entities will have an increased damping factor as the 2 entities vibrate out of phase with respect to one another. This effect is more pronounced at higher frequencies. In a polymer vapor treated string surface, the damping factor is minimized due to reduction of out of phase vibration. The disclosed invention thus allows treatment of all the strings, high frequency (treble) and lower frequency (bass) alike, constituting a "set" of strings.

Acoustic measurements of the increased damping present in competitive "laminated" or "coated" products compared to a polymer vapor treated string bear this out.

It is an object of the invention to provide a novel polymeric vapor surface treatment.

It is another object of the invention to form a vapor of polymer material in a vacuum environment and condense this vapor onto the surface of both wound and single-stranded musical instrument strings, resulting in nucleated polymer material on the string surface.

It is another object of the invention to apply to wound and single-stranded musical instrument strings such a surface treatment that does not adversely effect the musical properties of the strings.

It is another object of the invention to apply such a treatment to substantially the entire length of a musical instrument string.

A further object of the invention is to provide a polymeric surface treatment comprised of vapor deposited PTFE nucleates applied to musical instrument strings. A base layer of corrosion resistant metal such as gold, titanium, chromate conversion coating or other material may also be used, resulting in further improved mechanical properties and wear resistance and corrosion resistance.

BRIEF DESCRIPTION OF THE DRAWINGS

The foregoing and still other objects of this invention will become apparent, along with various advantages and features of novelty residing in the present embodiments, from study of the following drawings, in which:

FIG. 7 shows a polymer vapor treated wire.

FIG. 8 shows a spray coated wire.

FIG. 9 shows a polymer laminate on a wire.

DESCRIPTION OF THE PREFERRED EMBODIMENT

Figure 1:
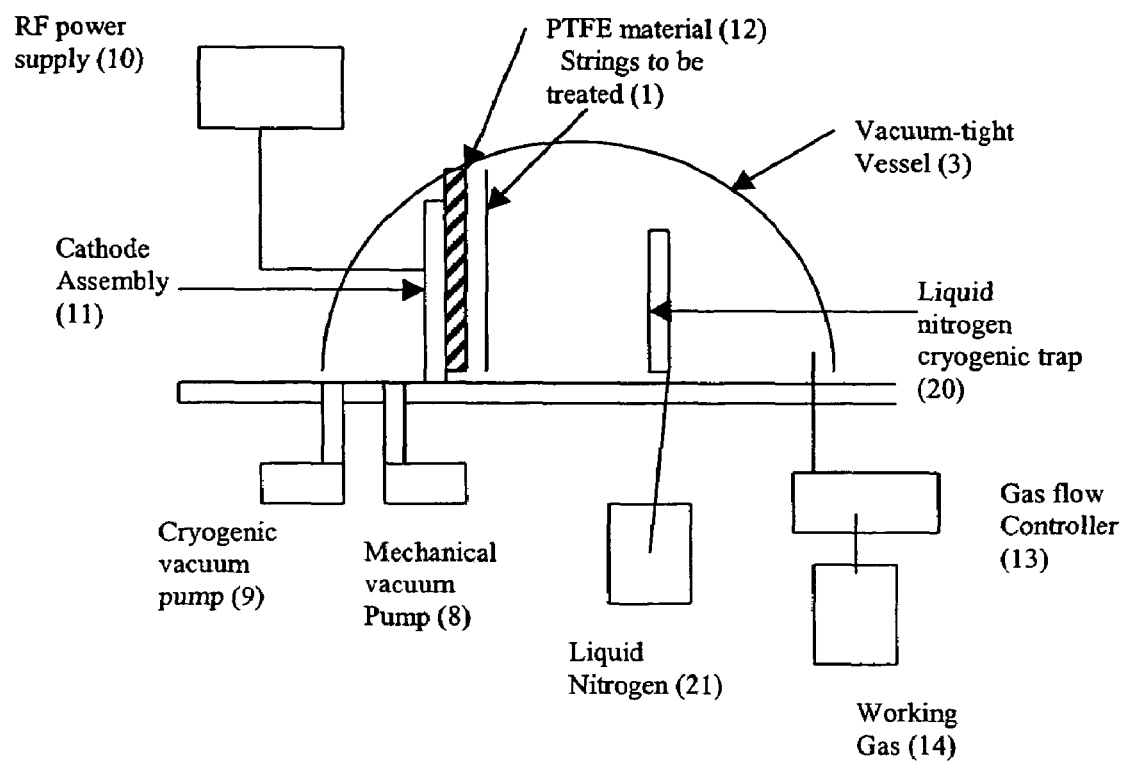
FIG. 1 is a schematic diagram of the process of treating musical instrument strings with a PTFE polymer vapor, using the plasma sputter deposition method.

Referring to the drawings, the invention is a PTFE vapor surface treatment method and composition, illustrated by application to musical instrument strings.

Vapor processes include several types of related methods whereby a vapor phase of PTFE polymer is created in a vacuum chamber and then allowed to condense onto the surface of a musical instrument string, resulting in the surface being treated with PTFE nucleated material. This treated musical instrument string, with nucleated PTFE polymer vapor condensed onto the surface, has many advantages over untreated strings, or other technologies using attached polymer films or porous structures, or spray type coatings. The surface being treated via exposure to vapor phase polymeric material shows distinct advantages over attached or adhered or laminated outer jackets or layers. One attribute of this effect is realized in the type of mechanical vibrations produced by a vapor polymer treated string versus a coated or jacketed or laminated string. This is evident in the quality of the musical sound produced by the strings, and the underlying microscopic mechanical phenomena resulting in virtually zero sound deadening as is caused by macroscopic laminates and coatings on musical strings. The polymer vapor surface treatment results in a polymer rich surface with no distinct interface between the substrate and the surface coating, as is evident in macroscopic laminates and coatings.

The invention may be implemented by plasma sputter deposition or other vapor deposition process applied to musical instrument strings using the following steps.

1. Cleaning the parts to be treated, for example by ultrasonic cleaning in detergent and then in acetone; optionally, immediately before the process begins, the parts may also be treated in a vacuum chamber by applying RF power directly to the substrate holder in order to plasma etch the parts and remove any residual contamination. This plasma cleaning also increases adhesion of the surface treatment.

2. The pressure in the vessel (3) is reduced to a base pressure of about 10-5 Torr or less. This may be accomplished using a mechanical vacuum pump (8), then a cryogenic pump (9). Additional pumping and removal of process contaminants during deposition may be achieved through the use of an optional cryogenic trap (20) using liquid nitrogen.

3. Process gas (14) can be selected from argon, nitrogen, (nitrogen is preferable) is flowed into the vessel (3) using a gas flow controller (13) to create an initial vacuum of about 2×10-2 Torr pressure or less and to maintain a vacuum of about 2×10-2. A flow rate of about 25 sccm has been found satisfactory. Alternatively, fluorocarbon gases are used in the plasma CVD and hot filament CVD processes.

4. In the RF sputtering method, an RF power supply (10) applies power to a suitable source such as a cathode assembly (11) onto which a PTFE sheet (12) is mounted, so as to ignite a plasma in the vessel (3). RF power at frequencies of 13.56 MHz and 500 Watts power have been found satisfactory with a 17"×5" PTFE sheet.

5. This results in a plasma glow discharge which produces a PTFE vapor within the vacuum vessel. The vapor is allowed to condense and nucleate onto the surface of the musical instrument string. The RF power is kept on until the desired amount of polymer material is condensed and nucleated on the surface. It has been found preferable to run the deposition process in cycles (e.g., three minutes with plasma on followed by three minutes with plasma off) so as to allow parts adequate time to cool to a desired temperature range and avoid overheating. The surface treated layer, normally in the range of about 0.1 to 10 microns, is normally achieved in a total of between three and thirty cycles.

6. Schematic diagrams of alternative methods used to form a vapor of PTFE polymer show ion beam sputtering, laser deposition, or flowing of a precursor fluorocarbon gas into the vessel in the presence of a heating filament or RF energy.

7. In all of the above processes a vapor phase of polymer material is created, and then allowed to nucleate onto the surface of the musical string resulting in polymer material condensed and nucleated on the surface.

The above process may be altered to use polymers other than PTFE. Polymers including polyimide, polyethylene, and acrylics have been successfully vapor deposited.

In all of the described vapor deposition methods, a vapor of polymer is created in a vacuum environment. This vapor is then allowed to condense and nucleate on the surface of a musical instrument string. The result is a musical instrument string which has a polymer condensed and nucleated on the surface.

The differences among the five outlined processes is the means by which the vapor phase of polymer material is formed. In the plasma sputter deposition process (FIG. 1), RF plasma is configured so as to have ions and energetic particles contained in the plasma accelerated into a polymer source material so as to eject microscopic polymer particles into a vacuum environment, forming a vapor of polymer material.

Figure 2:
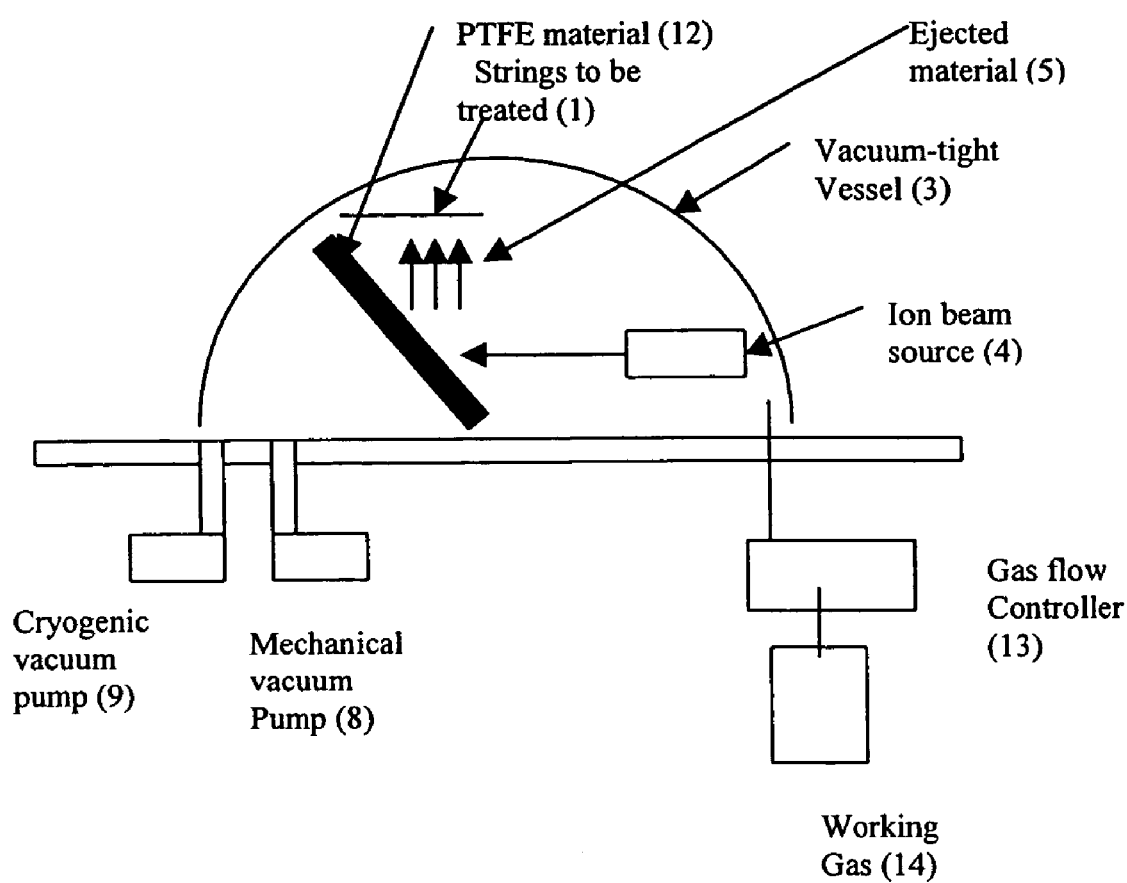
FIGS. 2, 3, 4, and 5 show alternative methods of polymer vapor deposition used to treat the surface of musical instrument strings. These methods are Ion Beam Sputtering (FIG. 2), Laser Deposition (FIG. 3), Plasma Chemical Vapor Deposition (FIG. 4), and Hot Filament Chemical Vapor Deposition (FIG. 5).
Figure 3:
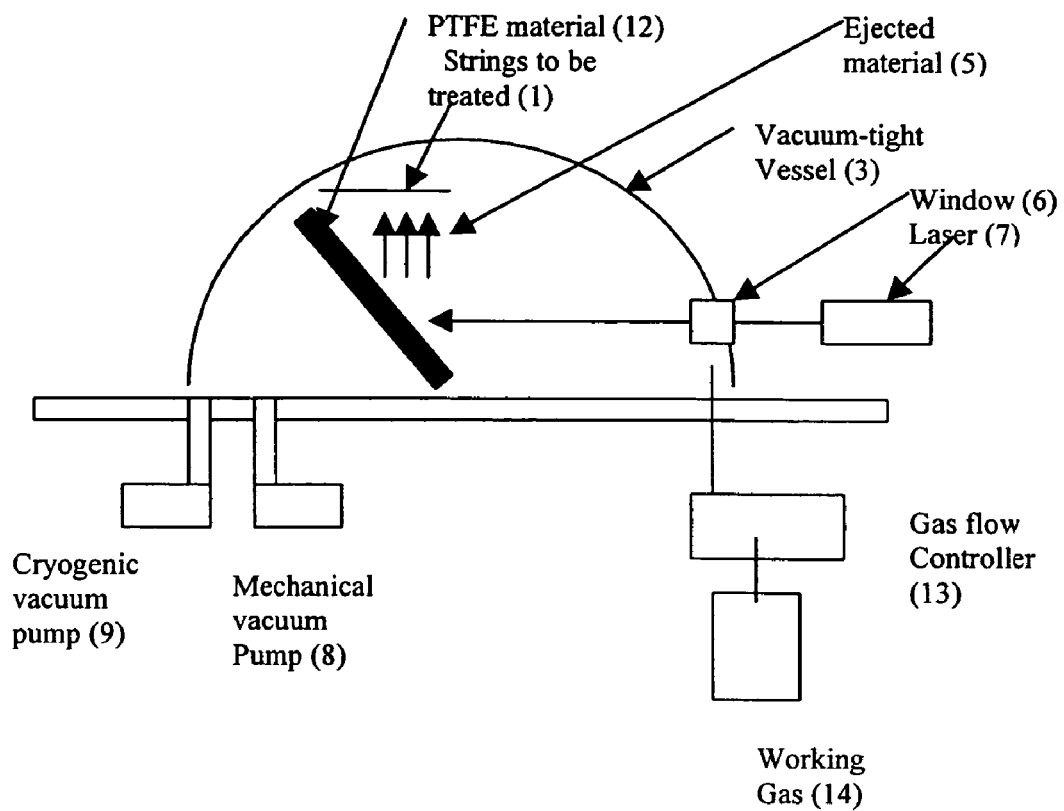
Figure 4:
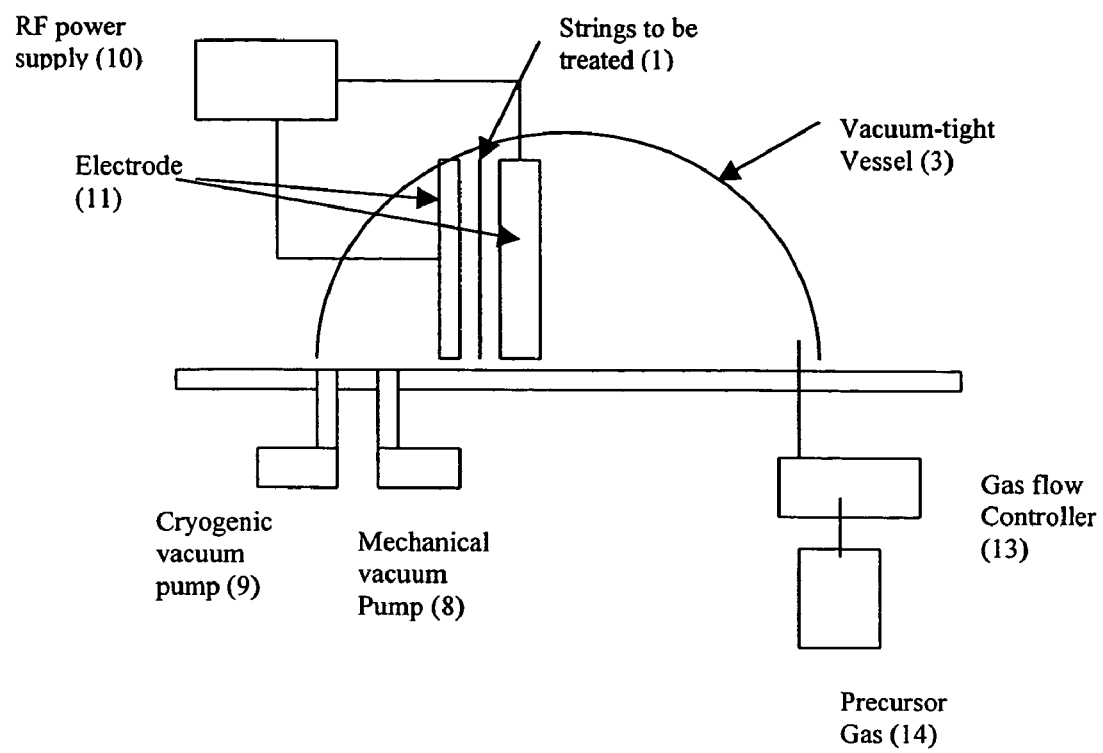
Figure 5:
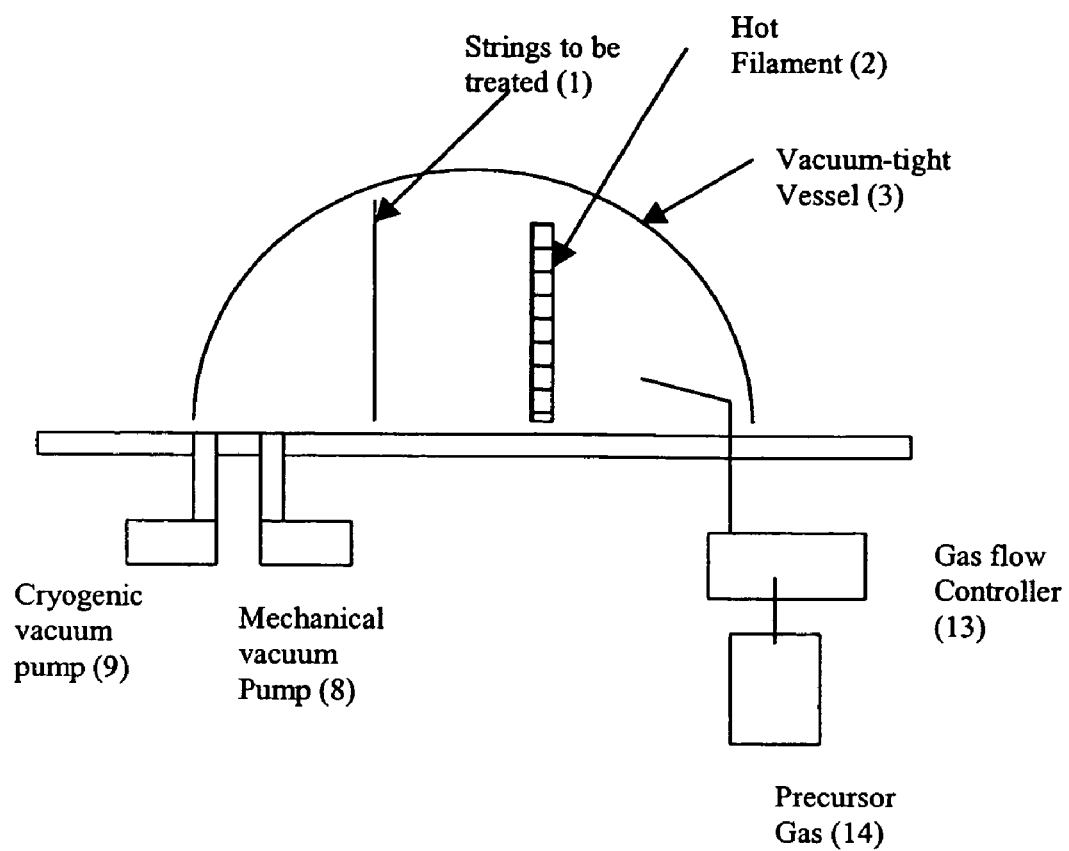
Figure 6:
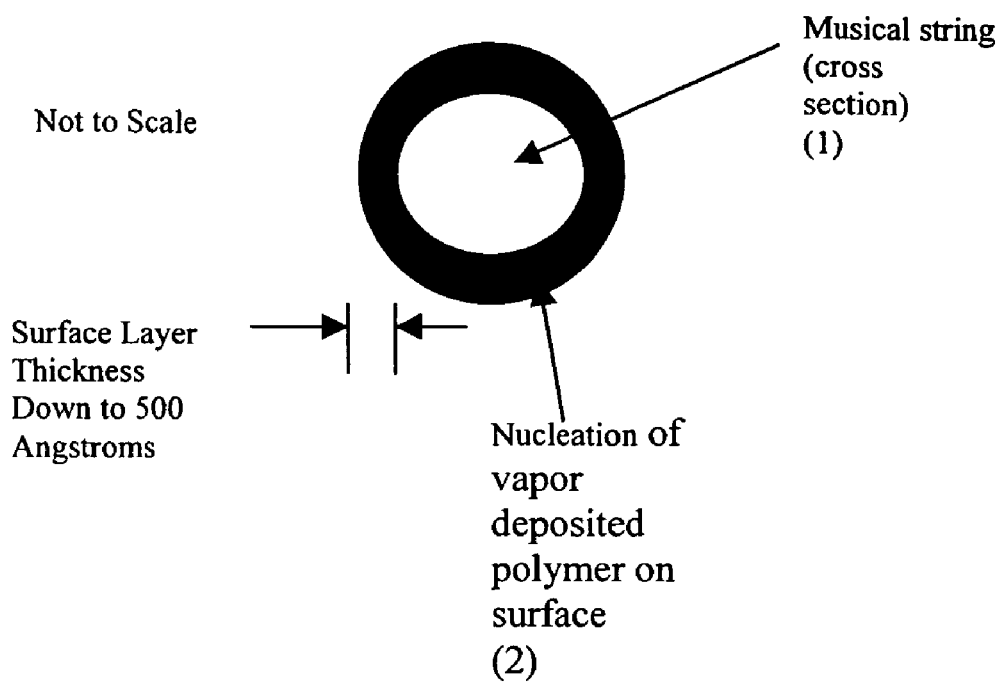
FIG. 6 is a schematic drawing showing a single-strand musical instrument string which has been treated with vapor deposited polymer nucleate.

In Ion beam sputtering (FIG. 2) the ejected polymer particles are formed by an ion beam being directed toward the surface of the polymer source material. In Laser deposition (FIG. 3) a pulsed beam of laser light is incident on the surface of the polymer source material, causing polymer particulate to be ablated off into a vapor phase. In the Plasma chemical vapor deposition (FIG. 4) and the Hot filament chemical vapor deposition method (FIG. 5) a precursor gas containing the desired elements to be used to form the vapor phase is admitted into the vacuum vessel in a controlled manner. A source of electromagnetic energy (Plasma CVD) or thermal energy (hot filament CVD) is used to excite the gas precursor which causes the gas molecules to react and form polymer vapors which are then allowed to condense and nucleate on the surface of the musical instrument string.

Other variations of the process can also be implemented to form a vapor phase of polymer material in a vacuum chamber, and subsequently allow the vapor to condense and nucleate on the surface of the musical instrument string. A general reference describing deposition techniques and alternatives is "Plasma Deposition and Treatment of Polymers", ed. W. W. Lee, R. d'Agostino, and M. R. Wertheimer, ISBN 1-55899-450-5, published by Materials Research Society.

Additional improvement to the effects of the PTFE polymer vapor surface treatment on the strings can be gained through the use of a chemical conversion layer, such as a chromate conversion process. This process reacts a thin layer of the metal surface of the string to form a chromate compound. In and of itself this layer has increased tarnish resistance. By using it in conjunction with the PTFE polymer vapor surface treatment, a synergistic enhancement to the performance of the musical strings is gained. This is believed to be due to the microscopic roughening caused by the chromate to allow the vapor deposited nucleates to "key" into the surface, further extending the longevity of the PTFE polymer vapor surface treatment.

Further variation in tailoring the properties of PTFE polymer vapor surface treatments include the following. The control of deposition parameters including cooling of the substrate below 0 deg C., along with high plasma density, and oblique angle of the source with respect to the substrate can be advantageously used to control porosity (pore size and pore fraction) of the nucleated polymeric material. This porosity can be utilized to house an additional material, such as a low friction liquid lubricant, or other substance. The result is an adhered layer of a liquid lubricant on the surface of the string, which provides a lowered coefficient of friction if desired. Such a liquid lubricant, if used alone, would not have the same amount of binding to the surface, and would mainly be held on by surface tension alone. The nucleated polymer vapor material has chemical and physical binding to the surface.

The control over porosity may also be used to modify the mechanical properties of the polymer. Porous PTFE bulk material, created through an entirely different mechanical stretching process, has been the subject of a great deal of interest. GORETEX (™) has done much work in the field of mechanically expanded "e-PTFE". Porous PTFE vapor surface treatments are expected to also have a great many new applications.

Higher substrate temperatures, above 0 deg C., and normal (perpendicular) angle of source with respect to substrate is favorable for a more featureless structure of the surface, with little porosity.

Methods and systems in accordance with the present invention provide for vapor deposited polymer coatings having a micron-thickness or less. As mentioned above, the vapor deposited polymer coatings contain an additional or second phase material to form a composite structure. Suitable second phase materials include low friction fluids including silicone fluid, mineral oil or other lubricants, biological materials including anticoagulants, antibiotics and other bio-active materials or drugs, and solid phase metals including silver, gold or platinum. The vapor deposited polymer coating has a thickness up to the tens of nanometers or greater, i.e. from about 10 nm to about 90 nm, preferably about 50 nm.

Vapor deposition methods in accordance with the present invention avoid problems common with spray or liquid type polymer coatings including heat damage to parts, imprecise dimensional control, flaking of the coating and peeling of the coating. Vapor deposition produces a thin film coating that imparts a minimum encumbrance or altering of the physical and mechanical properties of the article to be coated. Enhancements to specific properties are further gained through the formation of the two phase coating structure, incorporating an additional phase into the vapor deposited polymer coating matrix adhered to the surface of the article to be coated.

In one embodiment, the physical structure of the coating morphology is optimized to promote the most beneficial application of the second phase material. In general, the pore size and porosity fraction of the surface coating can be fine tuned via the deposition parameters. In one embodiment, fine tuning is accomplished by utilizing a relatively high rate deposition process, a relatively cool substrate temperature and an advantageous angle of placement of the substrate with respect to the vapor source. These process parameters are varied as necessary to increase the porosity of the coating structure. Non-parallel orientation between the vapor source and the substrate surface is utilized to favor formation of a porous structure.

Optimization of the pore size and porosity fraction is utilized to optimize the properties of the resulting composite structure and to control the parameters of the second phase material. The porosity can be varied from the nanometer level up to a fraction of a micron.

In one embodiment, the second phase material distributed into the vapor deposited polymer coating is a fluid. After a porous vapor deposited polymer structure has been formed, the coated article is removed from the deposition system, and a fluid is infused into the porous structure. In one embodiment, the fluid is a silicone fluid, for example dimethyl polysiloxane, a mineral oil or a similar low-friction lubricant fluid. The deposited polymer coating, well adhered to the surface of the article to be coated, anchors the desired second phase material to the surface of the substrate, resulting a polymer coating having increased lubricity, low-friction properties and improved anti-stick properties. The time and amount of infused material, as well as the physical properties of the fluid including viscosity and molecular structure, can be varied.

In another embodiment, the fluid is a biologically active fluid is used in order to achieve certain desired biological effects with the polymer coating. Both fluoropolymer coatings and biological substances including heparin or other anticoagulants and anti-biotic or anti-bacterial substances enhance the results achieved with medical devices such as implantable vascular stents through lowered cell adhesion in the bloodstream and reduced tissue reaction to the implant.

In another embodiment, the second phase material is a solid phase material introduced into the porous polymer coating matrix. Suitable solid phase materials include metals such as silver, gold, platinum and others. Silver has anti-microbial properties which are of benefit when used to control post-operative infection involving many implantable devices such as stents, electrodes and sensors. In addition, silver minimizes hazards inherent in using instruments, catheters or similar medical equipment. The porosity of the polymer coating is controlled for optimal device performance, and the second phase solid material is incorporated into the coating layer during the deposition process. This gives the option, via control of deposition parameters, to tailor the porosity fraction, pore size and the volume of second phase material introduced into the surface coating. A variety of physical properties can thus be controlled including diffusion, dissolution, elution and resorption of various substances including heparin, antibiotics, drugs, antimicrobials and other highly useful substances.

In one embodiment, a method for creating a porous polymer coating containing the second phase material includes cleaning the articles to be coated, for example using ultrasonic cleaning, detergent or solvent, and then allowed to dry. Suitable articles to be coated include stents, electrodes, mechanical assemblies and other components including mechanical components in need of specific low friction. Once cleaned and dried, the articles to be coated are placed onto a temperature controlled plate containing cooling channels. In one embodiment, the cooling channels are maintained between about −100° C. and about 0° C. The article on the temperature controlled plate is positioned in a vacuum tight vessel. The temperature of the cooling plate is monitored by a thermocouple, and a flow of liquid nitrogen is circulated to the plate to maintain the desired temperature.

Variation of the desired temperature affects the coating structure, with cold substrate temperatures yielding a higher porosity in the surface coating. In addition, the deposition rate has a controlling factor over the size and distribution of the porosity. The pressure vessel is evacuated through the use of a mechanical vacuum pump and a second stage pump, preferably a Cryo-pump high vacuum pump, with addition liquid nitrogen cold vessel traps within the deposition zone. This arrangement removes process contaminants during deposition, including by-products from the polymer deposition process. In one embodiment, initial process pumpdown pressure is about $10^{-5}$ Torr or less. Lower initial pressure favors higher purity of the deposited coating.

A process gas, for example nitrogen or argon, is admitted into the vessel under the control of a gas flow and pressure control system. In one embodiment, the gas flow and pressure control system is a commercially available "mass flow controller" used to maintain a total system pressure between about $2\times10^{-3}$ and about $200\times10^{-3}$ Torr. The total pressure during the process is an important parameter in tailoring the structure of the deposited coating and affects the porosity of the surface coating and distribution of second phase material in the surface coating.

A radio frequency (RF) power supply applies power to a suitable sputter source, for example a cathode assembly, onto which a polymer sheet (PTFE or other vapor depositable polymer) is attached. Suitable polymer sheets are made of any vapor depositable polymer, for example PTFE. In one embodiment, the RF power is maintained at about 13.56 MHz and from about 500 to about 1500 Watts for a 17"×5" polymer sheet. A plasma glow discharge results in a polymer coating being applied to the articles that have been placed at various angles to the source. Deviation from parallel orientation between the source and the plane of the surface of the article being coated is proportional to the extent of porosity of the deposited coating.

In another embodiment, the source material includes a polymer-metal composite structure. For example strips of polymer and metal that are cut and superimposed one on top of the other create a polymer coating with distributed metallic inclusions. The ratio of polymer to metal in the source is utilized to control coating composition. For a fluid phase second material, the porous coating is first removed from the vacuum vessel, and the desired fluid is applied to the surface coating and allowed to absorb. Residual fluid is removed, for example by mechanically wiping with a clean, absorbent wiper. In an alternative embodiment, the article is briefly dipped in a liquid known to be a solvent for the fluid first applied to the porous polymer coating.

The method for making the combination porous surface coating and second phase material in accordance with the present invention can be altered to use a variation on the type of vapor deposition in place of RF as described. Ion beam deposition, laser deposition and polymerization of various polymer pre-cursor gases, activated in the presence of RF or heat energy, can be used to create a vapor coating on a substrate having a similar cause and effect of deposition parameters including substrate orientation, temperature and deposition rate on coating structure. A separate suitable source may be needed for the case where a metal is also to be deposited within the vacuum vessel. The process is conducted using vapor depositable polymers including PTFE, polyethylene and polyimide or through the use of a gas species to decompose in the presence of RF or heat energy and to deposit the resulting polymeric material on the article to be coated. The porosity fraction, pore size and distribution of the second phase material is used to create the desired coating structure, resulting in a polymer coating with enhanced properties including biological and medical properties.

The current invention may be used to treat the winding wire or core wire prior to the winding wire being wrapped around the core wire. Alternatively, the wrapped string may be treated as a unit, for simplified processing.

While benefits may be produced by treating certain preselected portions of a musical instrument string (for example, those portions which are plucked, strummed or struck while playing, or those portions which are in contact with the instrument), in the preferred embodiment, substantially the entire length of the string is treated. Treating substantially the entire length produces additional benefits in uniformity, predictability and persistence of tone qualities.

Experimental Setup and Results

The above steps were carried out using the following equipment in a setup as in FIG. 1 (all components not specified below were standard, off the shelf, laboratory components):

1. component to be treated (e.g., a musical instrument string)
3. vacuum vessel
8. mechanical vacuum pump (Welch model No. 1398 or equivalent)
9. cryogenic vacuum pump (CT Instruments model No. CT-10 or equivalent)
10. RF power supply (ERA, Inc. model No. 7910 or equivalent)
11. cathode assembly (Aireco-Temescal Cathode Assembly model No. HRC-817 or equivalent)
12. PTFE material (pure, virgin PTFE)
13. In the alternate methods, an ion source (Commonwealth Scientific brand, cold cathode type or Kaufman type, or equivalent), or a laser (an excimer laser, a Nd-YAG laser or other common types of commercially available lasers are suitable), or variable voltage electric heating filament or RF energy (item 10) is suitable as input energy source.

Figure 7:
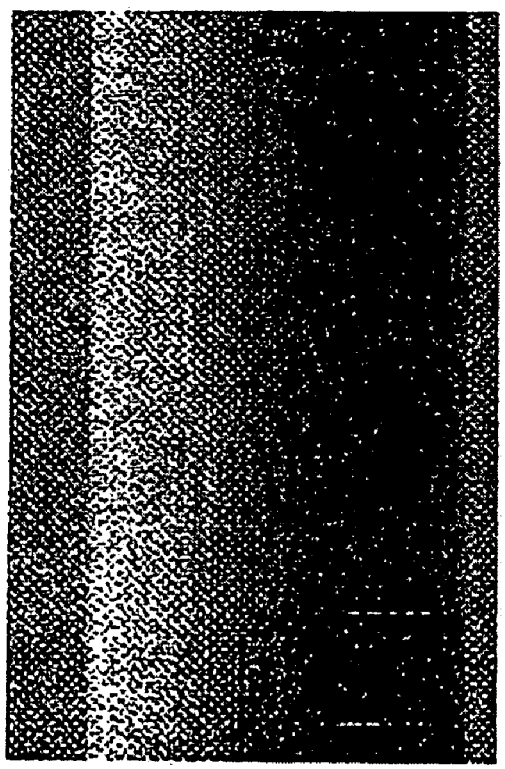
FIGS. 7 through 9 show scanning Electron Microscope Photographs depicting the difference between a polymer vapor treated surface and other types of coatings.
Figure 8:
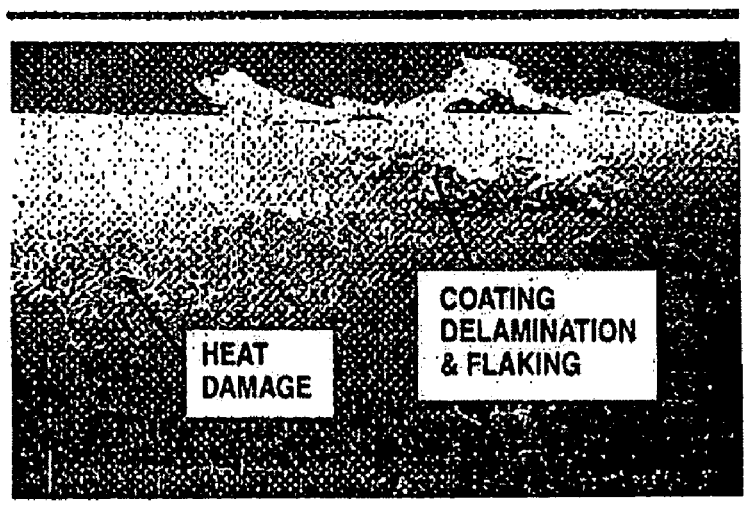
Figure 9:
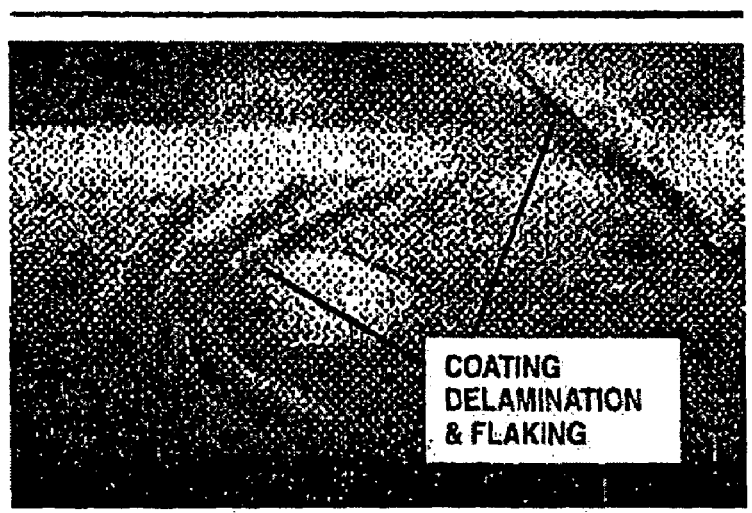

Referring to the scanning electron microscope images of FIGS. 7-9, some of the advantages over prior art techniques may be seen. FIG. 7 shows a polymer vapor treated wire, treated using the technique of the invention. As can be seen, the surface is smooth and well-adhered compared to FIGS. 8 and 9. FIG. 8 shows a spray coated wire, and FIG. 9 shows a polymer laminate on a wire. It can be seen that the spray coated wire of FIG. 8 and the polymer laminated wire of FIG. 9 exhibit coating delamination and flaking, and the spray coated wire of FIG. 8 also shows heat damage characteristic of high temperature bake out of spray coatings.

In order to test the benefits of the invention, the following experiment was carried out. Samples of musical instrument strings (Martin Guitar Phosphor Bronze Acoustic Guitar Strings) were obtained, and half of them were treated as follows: An immersion cleaning in acetone was performed to remove any residual oils. The strings were placed in a vacuum deposition system, and treated with PTFE polymer vapor on one side. The parts were rotated 180 degrees, and then the opposite sides were treated.

The treated and untreated samples were submitted to an independent testing laboratory, which conducted tests for corrosion resistance using a humidity test and a hydrogen sulfide vapor test.

The humidity test consisted of exposing treated and untreated strings to a relative humidity of 90% at 45 degrees C., for varying times up to 14 days. The hydrogen sulfide vapor test consisted of exposing the strings to a vapor of hydrogen sulfide gas, for periods of up to 48 hours.

It was concluded that the treated wound strings were noticeably less tarnished and corroded than the wound untreated strings. The treated strings remained a bright bronze color, while the untreated strings became discolored from the hydrogen sulfide gas. The untreated single-strand strings developed spots from the humidity exposure, where the treated strings did not.

While illustrated with respect to plasma sputter vapor deposition of PTFE, the invention may be applied using any similarly vaporizable polymer with the same techniques, modified in a manner which would be known to one skilled in the art.

Therefore, while specific embodiments of the invention have been shown and described in detail to illustrate the application of the principles of the invention, it will be understood that the invention may be embodied otherwise without departing from such principles and that various modifications, alternate constructions, and equivalents will occur to those skilled in the art given the benefit of this disclosure.

I claim:

1. A musical instrument string, comprising:
a core comprising a surface; and
a vapor depositable polymer adhered to a pre-selected portion of the surface of said core by a vapor deposition process that deposits a vapor phase of the vapor depositable polymer in a vacuum on the pre-selected portion of the surface of the core.

2. A musical instrument string as in claim 1, wherein the vapor deposition process comprises plasma sputter deposition.

3. A musical instrument string as in claim 1 wherein said vapor depositable polymer comprises PTFE.

4. A musical instrument string comprising a surface treatment as in claim 3 wherein the vapor deposition process comprises ion beam sputtering, laser deposition, or hot filament or plasma chemical vapor deposition.

5. The musical instrument string of claim 1, wherein the vapor deposition process comprises plasma vapor deposition.

6. The musical instrument string of claim 1, wherein the vapor deposition process utilizes a radio frequency cathode with an attached sheet of the vapor depositable polymer comprising a dimension that is at least about 100 times an average diameter of musical instrument strings.

7. The musical instrument string of claim 1, wherein the vapor deposition process comprises cycling a plasma on and off to control temperature and to maintain the musical instrument string within a desired temperature range.

8. The musical instrument string of claim 1, wherein the vapor depositable polymer adhered on the surface of the core comprises a porous polymer.

9. A musical instrument string, comprising:
a core comprising a surface; and
a polymer condensed and nucleated from a vapor phase of the polymer formed in a vacuum chamber onto a pre-selected portion of the surface of said core such that no distinct junction is formed between the polymer and the surface of the core.

10. A musical instrument string as in claim 9, wherein the vapor deposition process comprises plasma sputter deposition.

11. A musical instrument string as in claim 9 wherein said polymer condensed and nucleated on said surface is PTFE.

12. The musical instrument string of claim 9, wherein the vapor deposition process comprises plasma vapor deposition.

13. The musical instrument string of claim 9, wherein the vapor deposition process utilizes a radio frequency cathode with an attached sheet of the vapor depositable polymer comprising a dimension that is at least about 100 times an average diameter of musical instrument strings.

14. The musical instrument string of claim 9, wherein the vapor deposition process comprises cycling a plasma on and off to control temperature and to maintain the musical instrument string within a desired temperature range.

15. The musical instrument string of claim 9, wherein the vapor depositable polymer adhered on the surface of the core comprises a porous polymer.

16. A method of producing a musical instrument string having a polymeric surface treatment, comprising the steps of:
cleaning the musical instrument string to be treated;
providing a suitable vapor source;
placing said musical instrument string and said vapor source in a vacuum tight vessel;
reducing the pressure in said vessel to a base pressure of about 10-5 Torr or less; and
while maintaining a vacuum of about 20×10-3 Torr pressure and applying power to said source in said vessel, cycling the power to said source on and off until a desired thickness of PTFE coating is condensed and nucleated on said musical instrument string.

17. A polymeric treatment applied to a musical instrument string, produced by the process of claim 16.

18. A musical instrument string having a polymeric surface treatment wherein
said treatment is applied according to the method of claim 16.

19. A musical instrument string as in claim 18 wherein said musical instrument string is a core.

20. A musical instrument string as in claim 18 wherein said musical instrument string is a wound string, comprising a core and at least one strand wound around said core.

21. A musical instrument string, comprising:
a core;
at least one strand wound around said core, the strand comprising a surface; and
a vapor depositable polymer adhered to a pre-selected portion of the surface of said strand by a vapor deposition process that deposits a vapor phase of the vapor depositable polymer in a vacuum on the pre-selected portion of the surface of the strand.

22. A musical instrument string as in claim 21, wherein the vapor deposition process comprises plasma sputter deposition.

23. A musical instrument string as in claim 21 wherein said vapor depositable polymer comprises PTFE.

24. A musical instrument string comprising a surface treatment as in claim 23 wherein the vapor deposition process comprises ion beam sputtering, laser deposition, or hot filament or plasma chemical vapor deposition.

25. The musical instrument string of claim 21, wherein the vapor deposition process comprises plasma vapor deposition.

26. The musical instrument string of claim 21, wherein the vapor deposition process utilizes a radio frequency cathode with an attached sheet of the vapor depositable polymer comprising a dimension that is at least about 100 times an average diameter of musical instrument strings.

27. The musical instrument string of claim 21, wherein the vapor deposition process comprises cycling a plasma on and off to control temperature and to maintain the musical instrument string within a desired temperature range.

28. The musical instrument string of claim 21, wherein the vapor depositable polymer adhered on the surface of the core comprises a porous polymer.

29. A musical instrument string, comprising:
a core;
at least one strand wound around said core, the strand comprising a surface; and
a polymer condensed and nucleated from a vapor phase of the polymer formed in a vacuum chamber onto a pre-selected portion of the surface of said strand such that no distinct junction is formed between the polymer and the surface of the strand.

30. A musical instrument string as in claim 29, wherein the vapor deposition process comprises plasma sputter deposition.

31. A musical instrument string as in claim 29 wherein said polymer condensed and nucleated on said surface is PTFE.

32. The musical instrument string of claim 29 wherein the vapor deposition process comprises plasma vapor deposition.

33. The musical instrument string of claim 29, wherein the vapor deposition process utilizes a radio frequency cathode with an attached sheet of the vapor depositable polymer comprising a dimension that is at least about 100 times an average diameter of musical instrument strings.

34. The musical instrument string of claim 29, wherein the vapor deposition process comprises cycling a plasma on and off to control temperature and to maintain the musical instrument string within a desired temperature range.

35. The musical instrument string of claim 29, wherein the vapor depositable polymer adhered on the surface of the core comprises a porous polymer.

36. A musical instrument string, comprising:
   a core;
   at least one strand wound around said core, the core and the strand each comprising a surface; and
   a vapor depositable polymer adhered to a pre-selected portion of the surface of both said core and said strand wound around said core by a vapor deposition process that deposits a vapor phase of the vapor depositable polymer in a vacuum on the pre-selected portion of the surface of both the core and the strand.

37. The musical instrument string of claim 36, wherein the vapor deposition process comprises plasma vapor deposition.

38. The musical instrument string of claim 36, wherein the vapor deposition process utilizes a radio frequency cathode with an attached sheet of the vapor depositable polymer comprising a dimension that is at least about 100 times an average diameter of musical instrument strings.

39. The musical instrument string of claim 36, wherein the vapor deposition process comprises cycling a plasma on and off to control temperature and to maintain the musical instrument string within a desired temperature range.

40. The musical instrument string of claim 36, wherein the vapor depositable polymer adhered on the surface of the core comprises a porous polymer.

\* \* \* \* \*